(12) United States Patent
Pouilly et al.

(10) Patent No.: US 11,337,341 B2
(45) Date of Patent: May 17, 2022

(54) CONNECTION OF COOLING CIRCUIT PORTIONS FOR AN ASSEMBLY OF TWO HOUSINGS

(71) Applicant: Valeo Siemens eAutomotive France SAS, Cergy (FR)

(72) Inventors: Aurélien Pouilly, Poissy (FR); Sébastien Hary, Persan (FR); Philippe Mercier, Avrille (FR)

(73) Assignee: Valeo Siemens eAutomotive France SAS, Cergy (FR)

( * ) Notice: Subject to any disclaimer, the term of this patent is extended or adjusted under 35 U.S.C. 154(b) by 0 days.

(21) Appl. No.: 16/052,549

(22) Filed: Aug. 1, 2018

(65) Prior Publication Data

US 2019/0045671 A1 Feb. 7, 2019

(30) Foreign Application Priority Data

Aug. 2, 2017 (FR) ...................................... 1757431

(51) Int. Cl.
*H02M 3/24* (2006.01)
*H05K 7/20* (2006.01)
(Continued)

(52) U.S. Cl.
CPC .......... *H05K 7/20927* (2013.01); *B60K 11/02* (2013.01); *F28F 9/005* (2013.01); *F28F 9/0248* (2013.01); *F28F 9/26* (2013.01); *H02K 9/19* (2013.01); *H02M 3/24* (2013.01); *B60K 2001/006* (2013.01); *B60L 2240/36* (2013.01);
(Continued)

(58) Field of Classification Search
CPC ................ H05K 7/20927; B60K 11/02; B60K 2001/006; H02K 9/19; H02M 3/24; B60L 2240/36; B60Y 2410/10
See application file for complete search history.

(56) References Cited

U.S. PATENT DOCUMENTS 5,349,831 A * 9/1994 Daikoku ............... H01L 23/427
165/80.4
8,953,312 B2 * 2/2015 Shimasaki ......... H05K 7/20736
312/236
(Continued)

FOREIGN PATENT DOCUMENTS

| DE | 102015226023 A1 | 6/2017 |
| EP | 2966396 A1 | 1/2016 |
| WO | 2016049776 A1 | 4/2016 |

OTHER PUBLICATIONS

French Search Report of Application No. FR1757431.

*Primary Examiner* — James Wu
*Assistant Examiner* — Hung Q Dang
(74) *Attorney, Agent, or Firm* — JCIP; Joseph G. Chu; Jeremy I. Maynard

(57) ABSTRACT

The invention relates to an assembly of two housings, a first housing comprising a first cooling circuit portion and a second housing comprising a second cooling circuit portion, said of this cooling circuit portions being configured to form a cooling circuit with a fluid, each housing comprising a flat face comprising an opening of a respective cooling circuit portion and defining an interface of said cooling circuit, said cooling circuit portions being configured to be fluidically connected by plane-plane contact between said flat faces, said openings being arranged substantially opposite each other.

12 Claims, 3 Drawing Sheets

(51) Int. Cl.
  *B60K 11/02* (2006.01)
  *H02K 9/19* (2006.01)
  *F28F 9/02* (2006.01)
  *F28F 9/26* (2006.01)
  *F28F 9/00* (2006.01)
  *B60K 1/00* (2006.01)

(52) U.S. Cl.
  CPC ....... *B60Y 2306/05* (2013.01); *B60Y 2410/10* (2013.01); *F28F 2230/00* (2013.01); *F28F 2280/08* (2013.01)

(56) References Cited

U.S. PATENT DOCUMENTS

2004/0216491 A1* 11/2004 Sasso .................... C03B 9/3816
  65/162
2017/0112024 A1* 4/2017 Sato ........................ H05K 7/14

* cited by examiner

CONNECTION OF COOLING CIRCUIT PORTIONS FOR AN ASSEMBLY OF TWO HOUSINGS

TECHNICAL FIELD

The present invention relates to the field of electrical equipment, in particular for electric or hybrid vehicles, and relates more specifically to fluid cooling circuits, in particular to those with liquid water, implemented to prevent any overheating of electrical systems, such as inverters connected to the motor in electric motorisation systems.

In particular, the present invention aims at the connection between of fluid cooling circuit portions integrated into juxtaposed electrical system housings, including, for example, an inverter.

BACKGROUND

As is known, in electric motorisation systems, it is necessary to provide cooling means for a number of electrical systems, in particular the inverter supplying the electric motor, and said electric motor. To this end, according to the state of the art, a fluid cooling circuit, in particular with liquid water, is integrated into the electric motorisation system.

According to a known technology, a water-cooling circuit comprises ducts for circulating water in the housing enclosing the inverter, on the one hand, and a pipe to convey the water to the engine frame. By means of heat exchanges between the hot components and the cooler water, the purpose is to cool said hot components.

However, the volume available in vehicles is reduced, including for electric motorisation systems, and, as electrical systems become more complex, it has become common for the housing of the inverter to be arranged contiguous to the motor frame, particularly involving to reduce as much as possible the bulk induced by the cooling circuit.

Thus, the present invention is configured for implementation in the context of the fluidic connection of two cooling circuit portions respectively integrated into two housings, in particular two housings in which there are electrical systems. The present invention is particularly suitable when one of the housings comprises an inverter and the other an electric motor, as detailed above.

However, other use cases are provided. For example, one of the housings may comprise a DC-DC voltage converter and the other one an inverter. These examples are for illustrative purposes only and should not be interpreted restrictively.

According to the state of the art, for a fluidic connection of two cooling circuit portions integrated into contiguous electrical housings, inserts are necessary. In practice, in each housing, a bush, commonly referred to as "nozzle", or a sleeve, commonly referred to as "spigot", is inserted to form a fluid inlet or outlet, respectively, for each cooling circuit portion.

Such a nozzle or such a sleeve of the "spigot" type from a housing, such as a for example, a DC-DC voltage converter housing or an inverter housing, passes through a fluid inlet/outlet of a cooling circuit portion integrated into a second housing such as, respectively, an inverter housing or an electric motor housing, for example.

Said nozzles or said respective sleeves from an opening of a housing are inserted into an opening of the other housing to implement the fluidic connection. If necessary, a pipe is used to connect said nozzles or said sleeves from each housing, especially when they are not perfectly aligned opposite each other once the housings set up and contiguous.

These known means for the fluidic connection of two cooling circuit portions integrated into contiguous electrical housings have different drawbacks.

First, the risk of leakage is high, which is highly detrimental, particularly in the context of an electric motorisation system of a vehicle.

In addition, these known means generate a high bulk. Indeed, the known solutions, including the use of nozzles or sleeves, require to depress the nozzle or the sleeve used deeply in each of the housings, typically of the order of 30 mm, to ensure an acceptable sealing. Moreover, despite to depress deeply, leaks remain possible.

Finally, in order to implement the known solutions of the state of the art, it is imperative that the inlet and the outlet of the cooling circuit portions to be fluidically connected, each of said portions being integrated into each of the housings, are perfectly aligned. Otherwise, a pipe is necessary, with the drawback of increasing the bulk of the system.

However, in practice, the number of electrical functions implemented, especially in a vehicle, increases, and the volume dedicated to the electrical systems included in the housings, such as the housing of the inverter, also increases. This notably causes an offset and an increase of the volume of the inverter power module corresponding to the part of the inverter to be cooled and induces misalignment between the fluid outlet of the cooling circuit portion integrated into the housing of the inverter and the fluid inlet of the cooling circuit portion integrated into the electric motor housing used.

The present invention makes it possible to solve at least in part the aforementioned drawbacks by means of a fluidic connection of the circuit portions integrated into two housings, in particular two housings enclosing electrical systems, through a plane/plane contact and the implementation of a seal surrounding the area in which the fluidic connection is made, said seal being compressed between the two housings.

SUMMARY

More specifically, the present invention consists of a assembly of two housings, a first housing comprising a first cooling circuit portion and a second housing comprising a second cooling circuit portion, said cooling circuit portions being configured to form a cooling circuit with a fluid, each housing comprising a flat face including a respective cooling circuit portion opening and defining an interface of said cooling circuit, said cooling circuit portions being configured to be fluidically connected through plane-plane contact between said flat faces, said openings being arranged substantially opposite to each other.

Thanks to the invention, two fluid cooling circuit portions integrated in two separate housings are fluidically connected in a sealed manner while ensuring a minimised bulk in the absence of any nozzle, sleeve or the like and of any pipe.

According to an embodiment, one of said openings forming an inlet of a cooling circuit portion and the other of said openings forming an outlet of a cooling circuit portion, at least one of the openings further comprises a recess arranged in the corresponding flat face and extending from said opening so that the periphery of said recess also encompasses the other of said openings when the flat faces are in contact, thereby providing fluidic connection of the two cooling circuit portions, including when the inlet and the outlet are misaligned.

According to an embodiment, said recess comprises a section having an area of between 50 mm² and 1600 mm².

According to a preferred embodiment, said recess has at least one rounded edge portion so as to promote fluid flow.

According to an embodiment, one of the two housings comprises a DC-DC voltage converter and the other housing comprises an inverter.

According to an embodiment, one of the two housings comprises an inverter and the other housing comprises an electric motor.

According to an embodiment, each of the faces brought into plane-plane contact respectively comprises a recess configured so that their respective peripheries encompass both of the opening of the first cooling circuit portion and the opening of the second cooling circuit portion.

Advantageously, each of the faces brought into plane-plane contact has a roughness of less than or equal to 6.3 µm.

According to an embodiment, the assembly further comprises a seal configured to surround said openings and be compressed between said flat faces when said plane faces are brought into plane-plane contact.

In this way, the device according to the invention also has the advantage of being easy to implement because during assembly of the two adapted housings, it is sufficient to position the seal as appropriate and then join the two adapted housings in a contiguous manner in order to compress said seal. The fluidic connection of the two cooling circuit portions is then automatic.

According to an embodiment, the first and second cooling circuit portions are configured to be fluidically connected only through said plane-plane contact.

DESCRIPTION OF THE DRAWINGS

The invention will be better understood on reading the description which will follow, given solely by way of example, and referring to the attached drawings given by way of non-limiting examples, in which identical references are given to similar items, and in which.

It should be noted that the figures disclose the invention in detail to implement the invention, said figures may of course be used to better define the invention if necessary.

DETAILED DESCRIPTION

In the description hereinafter, the invention will be described in its application to an electric or hybrid motor vehicle without this being limiting the scope of the present invention.

Figure 1:
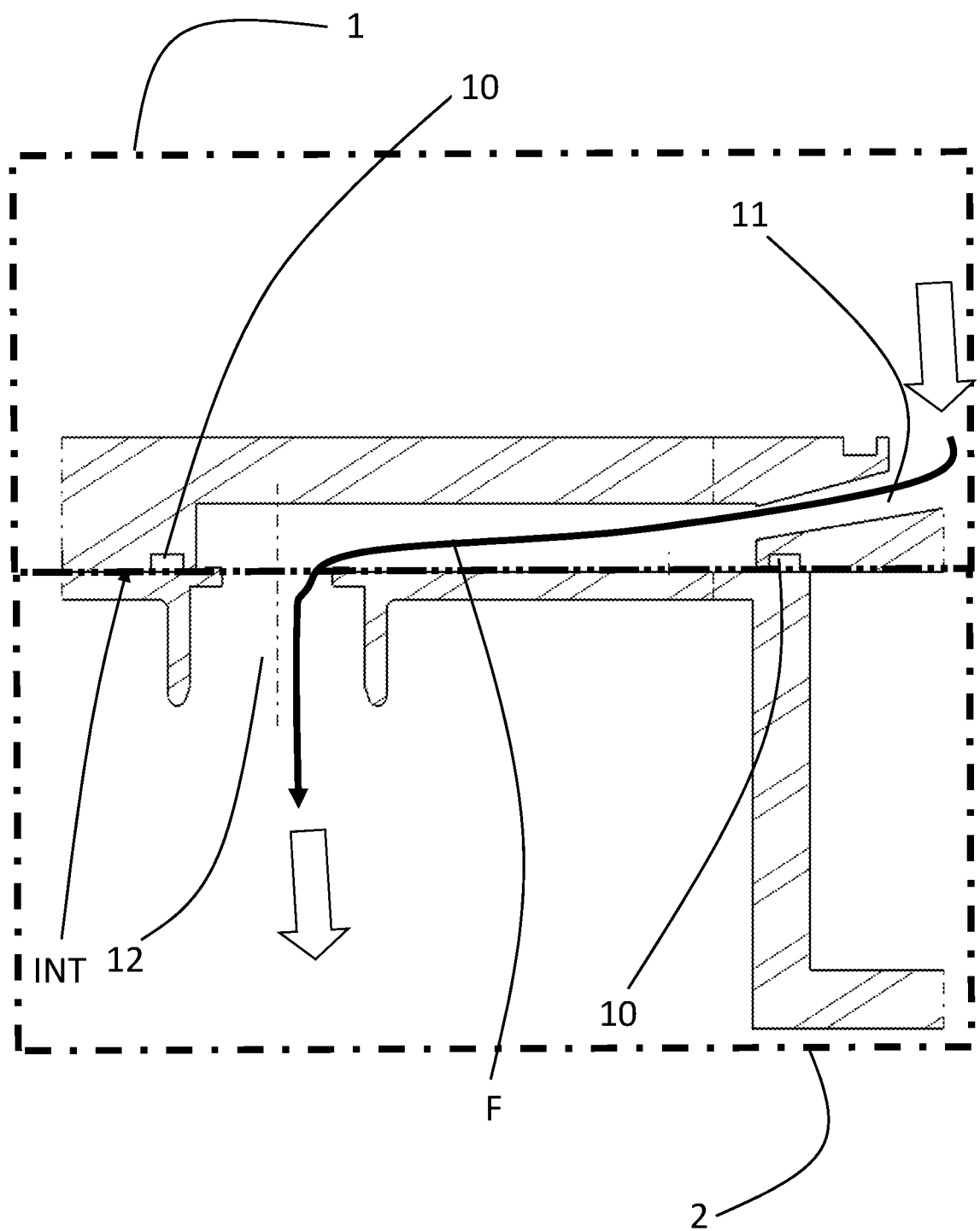
FIG. 1 shows a diagram of an embodiment of the invention for the fluidic connection of two integrated cooling circuit portions integrated in contiguous housings.

FIG. 1 shows a first embodiment of the present invention.

A first housing 1, in particular a housing comprising an inverter, and a second housing 2, in particular comprising an electric motor, are brought into plane-plane contact along a respective face forming an interface INT between two portions of a fluid cooling circuit, in particular a water cooling circuit. The fluid cooling circuit partially shown in FIG. 1 is therefore formed of a first portion and a second portion respectively integrated into the first housing 1 and the second housing 2. Each cooling circuit portion is made of ducts arranged in each housing 1, 2, said ducts being able to receive a cooling fluid F. In FIG. 1 is shown in particular the fluidic connection area of the two cooling circuit portions.

The first cooling circuit portion, integrated into the first housing 1, is, according to one embodiment, configured to cool a power module of an integrated inverter to said first housing 1.

The second cooling circuit portion, integrated into the second housing 2, is, according to one embodiment, configured to cool an electric motor integrated into said second housing 2.

The first housing 1 comprises a fluid outlet 11 of the first cooling circuit portion and the second housing 2 comprises a fluid inlet 12 of the second cooling circuit portion.

Said inlet 12 and said outlet 11 are preferably opposite each other when the two housings 1, 2 are contiguous. However, if necessary, said inlet 12 and said outlet 11 may be misaligned when the housings 1, 2 are put in place and contiguous. The present invention notably makes it possible to solve this technical problem.

Figure 2:
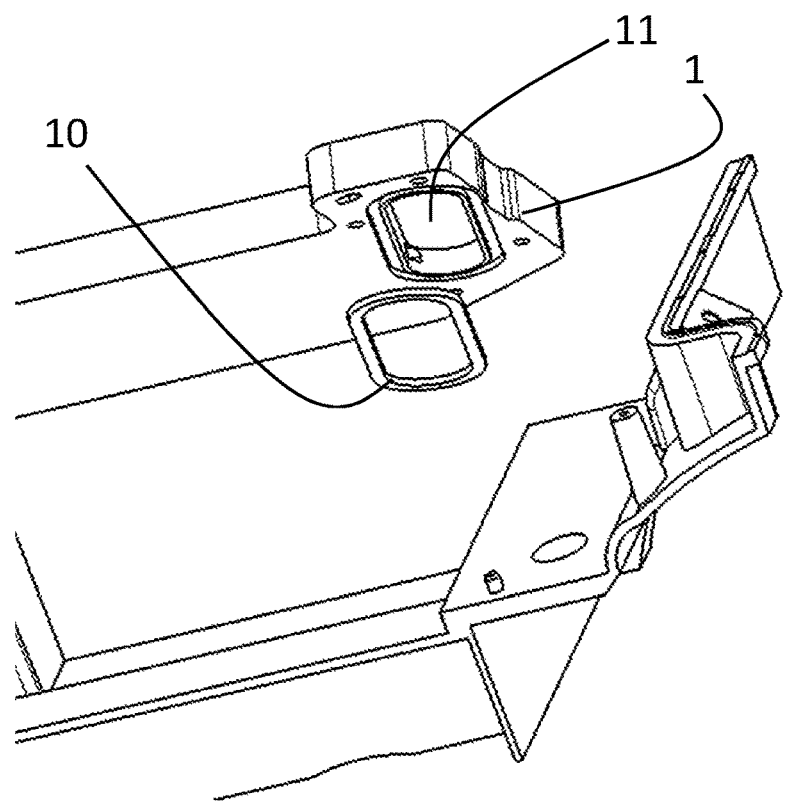
FIG. 2 shows an O-ring configured to be compressed between two contiguous housings to implement the present invention.

An O-ring 10, as in FIG. 2, or a circular seal for example, or a seal of any suitable shape, is positioned to surround said inlet 12 and said outlet 11 and is compressed between the two faces of the two contiguous housings 1, 2, so that the first cooling circuit portion and the second cooling circuit portion are fluidically connected in a sealed manner.

Figure 3:
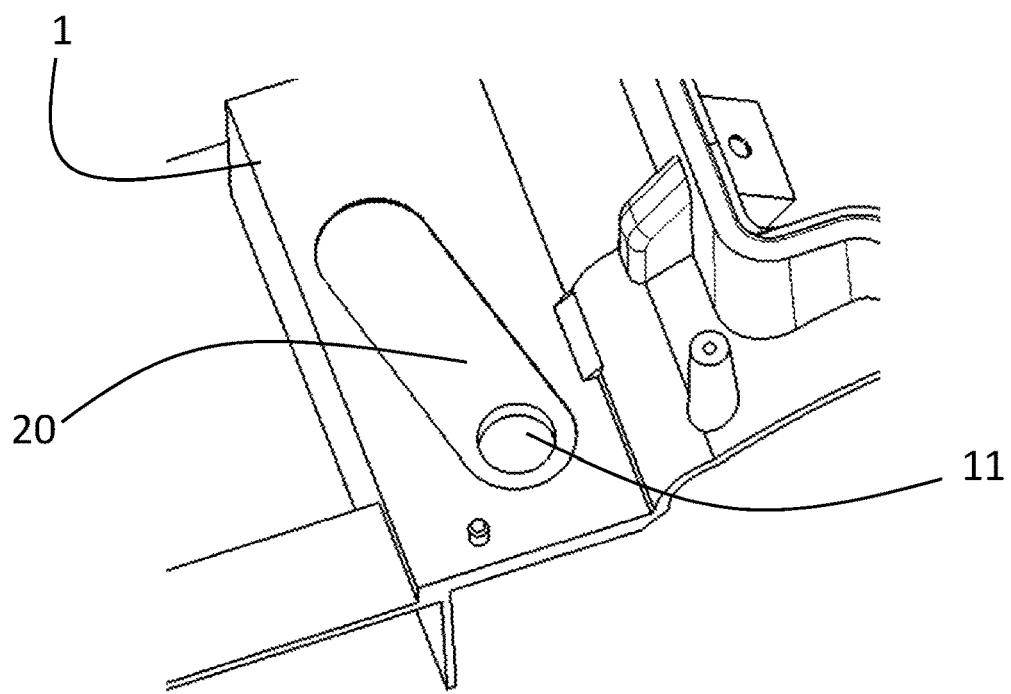
FIG. 3 is a view of a recess made on one face of a housing around a fluid inlet or outlet of a cooling circuit portion integrated in said housing.

With reference to FIG. 3, according to one embodiment, a recess 20 is provided, in particular for cases where the inlet 12 of the cooling circuit portion belonging to the second housing 2 and the outlet 11 of the cooling circuit portion belonging to the first housing 1 are not perfectly aligned when said housings 1, 2 are put in place and contiguous.

As shown in FIG. 3, such a recess 20 is then arranged on at least one of the faces of the two contiguous housings 1, 2. The recess 20 extends from the opening 11, 12 of the cooling circuit portion opening out from the face on which said recess 20 is arranged, said opening 11, 12 forming an inlet 12 or an outlet 11 of said cooling circuit portion.

Said recess 20 is configured so that its periphery encompasses, by construction, besides the inlet 12 or the outlet 11 of the cooling circuit portion of the housing face to which it belongs, also the inlet 12 or the outlet 11 of the other cooling circuit portion, located on the face of the other housing.

Through said recess 20, the fluid F coming from the outlet 11 of the first circuit portion is conveyed, via the recess 20, to the inlet 12 of the second cooling circuit portion, the seal 10 compressed between the two contiguous housings ensuring the sealing.

Such a recess 20 makes it possible to promote the flow of fluid F in the cooling circuit formed by the circuit portions integrated into each of the housings.

Preferably, said recess 20 has a height adapted to promote the flow of fluid from the first cooling circuit portion to the second cooling circuit portion. According to a preferred embodiment, said recess 20 is present on only one of the housings 1, 2 while the other housing 1, 2 has a flatness of high quality. For example, the roughness of the face of the housing 1, 2 comprising no recess is preferably less than 6.3 µm.

Without a recess, the flatness of the faces of the two contiguous housings 1, 2 should preferably be of high quality, with a roughness preferably lower than 6.3 µm.

A recess 20 can also be provided on the two contiguous faces.

According to an embodiment, said recess(es) 20 may comprise a rounded edge portion to promote the fluid flow.

Figure 4:
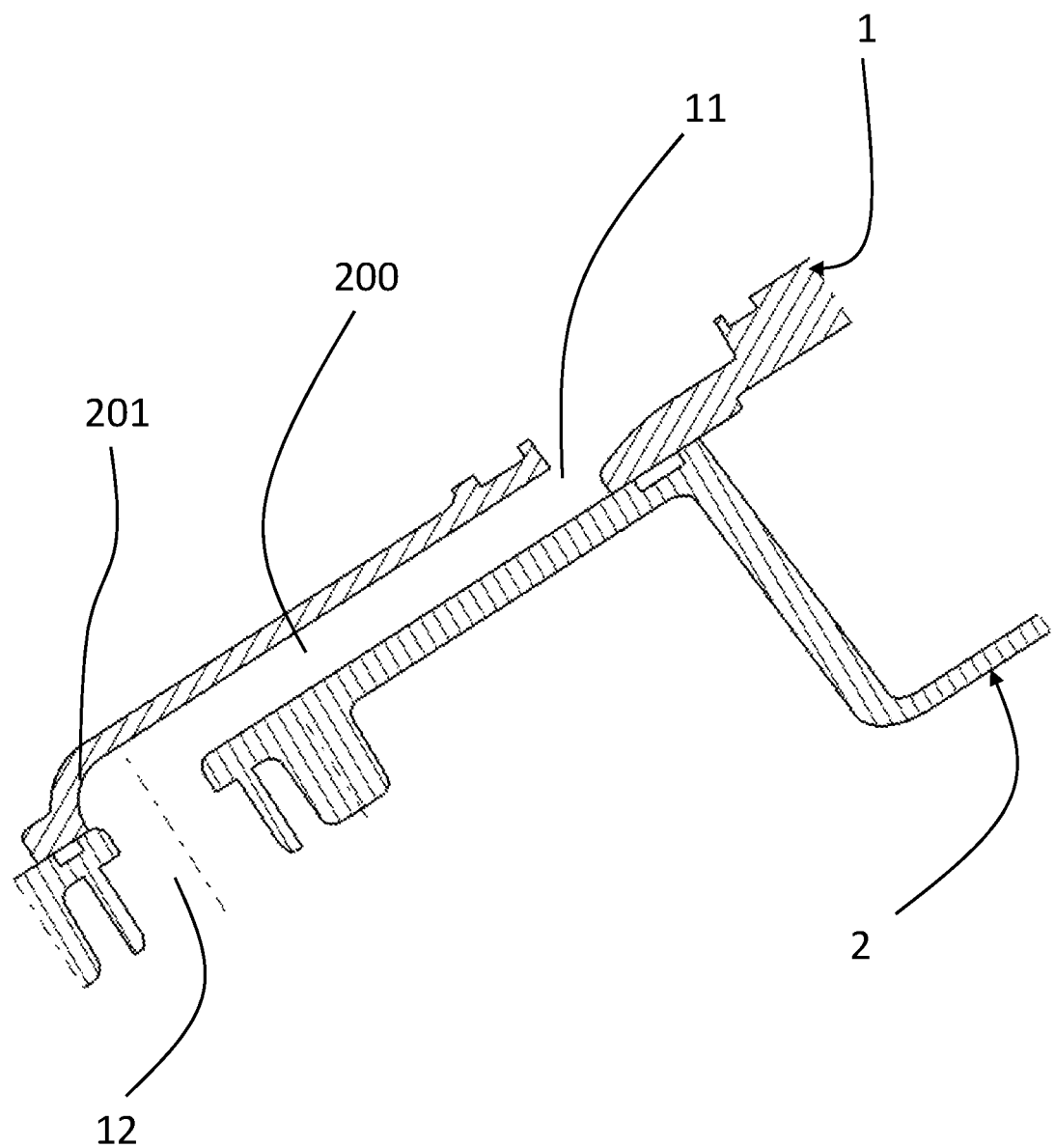
FIG. 4 shows a housing with a recess having a rounding configured to optimize fluid flow from one portion of the cooling circuit to the other.

With reference to FIG. 4, a recess 200 is thus arranged, only on one face or on the two contiguous faces, and comprises a rounded edge portion 201, having a radius of curvature adapted to promote the flow of the fluid via said recess 200 during its passage from the first cooling circuit portion to the second cooling circuit portion.

The rounded edge portion 201 promotes the flow of the fluid F and hence the rate at which the fluid F can circulate in the cooling circuit, thereby improving the efficiency of the cooling circuit.

In summary, by means of a plane-plane contact between the faces of two contiguous housings 1, 2 each comprising a portion of a cooling circuit with a fluid F, the present invention makes it possible to ensure the fluidic connection, in a sealed manner, of said two the cooling circuit portions. To this end, the outlet 11 of the first cooling circuit portion, opening out from the face of the first housing 1, and the inlet 12 of the second cooling circuit portion, opening out from the face of the second housing 2, are connected to one another by means of the plane-plane contact established between said two faces and a seal 10, compressed between said two faces, ensuring the sealing of the fluidic connection.

According to a preferred embodiment, at least one of said faces comprises a recess 20, 200, which may have a rounded edge portion 201, the periphery of which encompasses both the inlet 12 or the fluid outlet 11 of the face to which it belongs and the input 12 or the output 11, respectively, belonging to the face of the other housing 1, 2.

In the latter case, the fluid F is conveyed, via the recess 20, 200, from the outlet 11 of the first cooling circuit portion to the inlet 12 of the second cooling circuit portion, in a sealed manner, through the seal 10, and so as to have a minimum bulk, in the absence of any nozzle, sleeve or any pipe.

The invention claimed is:

1. An assembly comprising two housings, a first housing comprising a first cooling circuit portion for cooling a first heat load integrated into the first housing and a second housing comprising a second cooling circuit portion for cooling a second heat load integrated into the second housing, said cooling circuit portions being configured to form a cooling circuit with a fluid, the first housing having a first opening, the second housing having a second opening, each housing comprising a flat face defining an interface of said cooling circuit, said cooling circuit portions being configured to be fluidically connected through plane-plane contact between said flat faces, the first opening being arranged on the left side of the assembly, the second opening being arranged on the right side of the assembly, wherein one of said openings forms an inlet of the second cooling circuit portion and the other of said openings forms an outlet of the first cooling circuit portion, wherein a recess extends from at least one of the openings said recess arranged in the corresponding flat face and extending from said at least one of the openings so that the periphery of said recess also encompasses the other of said openings when the flat faces are in plane-plane contact, thereby providing fluidic connection of the two cooling circuit portions, including when the inlet and the outlet are misaligned;

wherein the first heat load comprises an inverter and the second heat load comprises an electric motor.

2. The assembly comprising two housings according to claim 1, wherein said recess comprises a section having an area of between 50 mm$^2$ and 1600 mm$^2$.

3. The assembly comprising two housings according to claim 1, wherein said recess has at least one rounded edge portion so as to promote fluid flow.

4. The assembly comprising two housings according to claim 1, wherein one of the two housings comprises a DC-DC voltage converter and the other housing comprises an inverter.

5. The assembly comprising two housings according to claim 1, wherein one of the two housings comprises an inverter and the other housing comprises an electric motor.

6. The assembly comprising two housings according to claim 1, wherein each of the faces brought into plane-plane contact respectively comprises said recess configured so that their respective peripheries encompass both of the opening of the first cooling circuit portion and the opening of the second cooling circuit portion.

7. The assembly comprising two housings according to claim 1, wherein each of the faces brought in plane-plane contact has a roughness of less than 6.3 μm.

8. The assembly comprising two housings according to claim 1, further comprising a seal configured to surround said openings and be compressed between said flat faces when said plane faces are brought into plane-plane contact.

9. The assembly comprising two housings according to claim 1, wherein the first and second cooling circuit portions are configured to be fluidically connected only through said plane-plane contact.

10. The assembly comprising two housings according to claim 1, wherein the assembly is configured to be employed in an electric or hybrid motor vehicle.

11. The assembly comprising two housings according to claim 1, wherein the fluid comprises water or a water-based solution.

12. The assembly comprising two housings according to claim 1, wherein an O-ring is configured to be compressed between the first and second housings.

* * * * *